(12) United States Patent
Beltrami et al.

(10) Patent No.: US 8,755,229 B1
(45) Date of Patent: Jun. 17, 2014

(54) LIMITING FLASH MEMORY OVER PROGRAMMING

(75) Inventors: Silvia Beltrami, Sorisole (IT); Angelo Visconti, Appiano Gentile (IT)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 12/490,002

(22) Filed: Jun. 23, 2009

(51) Int. Cl.
*G11C 11/34* (2006.01)
*G11C 16/04* (2006.01)

(52) U.S. Cl.
USPC ................ 365/185.18; 365/185.12

(58) Field of Classification Search
CPC ...................................... G11C 16/10
USPC ........................ 365/185.01–185.33
See application file for complete search history.

(56) References Cited

U.S. PATENT DOCUMENTS

| | | | |
|---|---|---|---|
| 6,326,274 B2 | 12/2001 | Rost | |
| 6,327,183 B1 * | 12/2001 | Pawletko et al. | 365/185.18 |
| 6,556,504 B2 | 4/2003 | Kwon et al. | |
| 6,643,177 B1 | 11/2003 | Le | |
| 6,768,674 B2 | 7/2004 | Park | |
| 7,362,616 B2 | 4/2008 | Bovino | |
| 7,512,847 B2 | 3/2009 | Bychkov | |
| 7,551,482 B2 * | 6/2009 | Kamei et al. | 365/185.19 |
| 7,570,520 B2 * | 8/2009 | Kamei et al. | 365/185.19 |
| 7,599,223 B2 * | 10/2009 | Tu et al. | 365/185.22 |
| 7,649,782 B2 * | 1/2010 | Eguchi et al. | 365/185.22 |
| 7,652,928 B2 * | 1/2010 | Yanagidaira et al. | 365/185.23 |
| 7,679,961 B2 * | 3/2010 | Lee et al. | 365/185.19 |
| 7,796,434 B2 * | 9/2010 | Jang et al. | 365/185.18 |
| 7,916,543 B2 * | 3/2011 | Goda et al. | 365/185.17 |
| 8,514,629 B2 * | 8/2013 | Goda et al. | 365/185.2 |
| 2008/0266970 A1 * | 10/2008 | Lee et al. | 365/185.19 |
| 2009/0020803 A1 | 1/2009 | Watanabe | |

OTHER PUBLICATIONS

Patent Application filed Jul. 21, 2009 in co-pending U.S. Appl. No. 12/506,934, 33 pages.
U.S. Appl. No. 12/506,934, filed Jul. 21, 2009, 42 pages.
U.S. Appl. No. 12/506,934, Filing receipt and Notice to File Missing Parts, mailed Aug. 6, 2009, 5 pages.
U.S. Appl. No. 12/506,934, Response to Notice to File Missing Parts, mailed Oct. 5, 2009, 4 pages.
U.S. Appl. No. 12/506,934, Updated Filing Receipt, mailed Apr. 12, 2010, 3 pages.
U.S. Appl. No. 12/506,934. Non-Final Office Action, mailed Dec. 29, 2010, 9 pages.
U.S. Appl. No. 12/506,934, Abandonment, mailed Jul. 26, 2011, 2 pages.

* cited by examiner

*Primary Examiner* — Kretelia Graham
(74) *Attorney, Agent, or Firm* — Knobbe, Martens, Olson & Bear, LLP

(57) ABSTRACT

Certain aspects of this disclosure relate to programming an at least one flash memory cell using an at least one programming pulse with a new programming voltage having a level. The level is maintained in at least one page in a block of a flash memory controller memory, wherein the level varies as a function of a number of programming cycles applied to the at least one flash memory cell.

18 Claims, 8 Drawing Sheets

LIMITING FLASH MEMORY OVER PROGRAMMING

BACKGROUND

1. Field

Certain aspects of this disclosure may relate to flash memory cells and devices.

2. Information

Flash memory cells may undergo programming to change their output electrical state (such as flash memory cells being programmed between ON states or OFF states). Certain flash memory cells may experience over programming in which they may provide an incorrect output state (e.g., ON or OFF states). For example, a first over programmed flash memory cell can induce an incorrect output status of a second flash memory cell that is in electrical communication with the same bit line as the first over programmed flash memory cell. In certain instances, for example, the second flash memory cell can be read as in an OFF state while it should in actuality be read in an ON state. Over programming becomes more common as flash memory cells age, which might occur as the flash memory cells cycle through a greater number of program/erase cycles.

With certain instances of over programming, flash memory cells may indicate an incorrect state. Certain attempts have been made to reduce the occurrence of over programming of flash memory cells. It may be desired to increase flash memory cell density, increase flash memory device performance, and enhance reliability of operation with flash memory cells and devices.

DETAILED DESCRIPTION

Certain aspects of FIGS. 1 to 10 describe flash memory programming techniques relating to programming operation of flash memory cells. Certain operational programming characteristics of flash memory cells may degrade over time, some as a result of cycling. Cycling comprises a programming and erasing within flash memory cell. A number of flash memory programming techniques are described that may maintain the programming speeds, operational voltage characteristics, and reliability of the flash memory device (if fresh and/or over its lifetime). The flash memory programming technique additionally provides performance consistency of the flash memory device by speeding up its performance at the beginning of its life, a time when the programming speed may be the slowest.

1. Flash Memory Cells and Flash Memory Devices

Flash memory cells 50 are one type of non-volatile memory that may be capable of storing information without an external bias. Flash memory device 51 may comprise a number of flash memory cells 50, which may be arranged in a high cell density array. Applications for flash memory devices 51 may include, but are not limited to: certain basic input/output system (BIOS) devices for computers, compact flash, memory sticks, digital cameras, personal display assistants (PDAs), cell phones, memory cards for video games, memory cards, and solid state drives (e.g., used to replace hard drives in computers).

Figure 1:
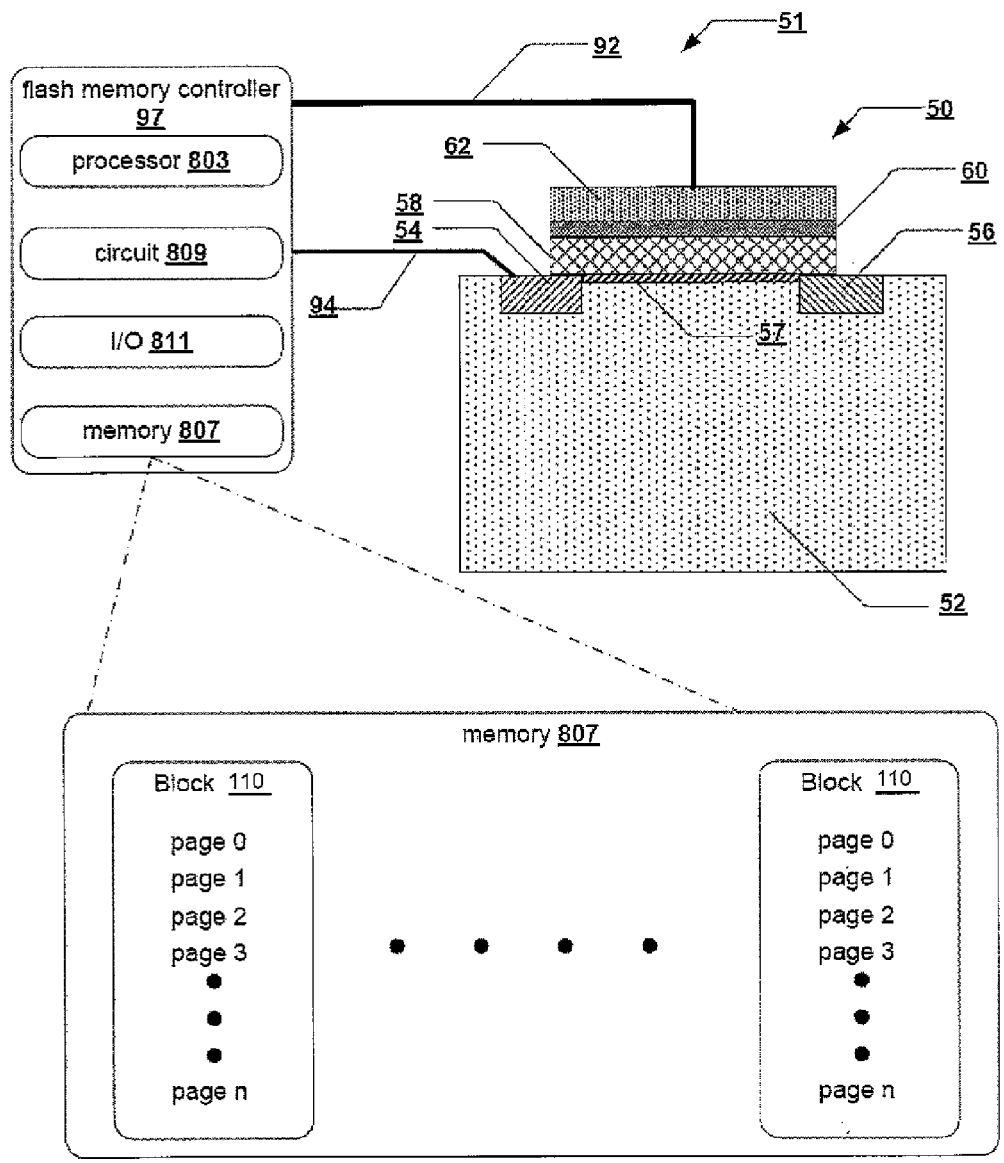
FIG. 1 is a schematic diagram of a structure of one embodiment of a flash memory cell.

Certain embodiments of flash memory cells 50 of FIG. 1 comprise substrate 52, source 54, drain 56, tunnel oxide layer 57, floating gate 58, control gate 62, and a thin oxide layer 60 situated between floating gate 58 and control gate 62. A flash memory device 51 may comprise two-dimensional arrays of flash memory cells 50 arranged across substrate 52, as described with respect to FIG. 2. Certain embodiments of flash memory cells 50 may be configured either as NAND type or NOR type flash memory cells, which have different operating characteristics depending upon associated control circuitry. NAND flash memory cells differ mainly from NOR flash memory cells based on their cell array architecture. NOR flash memory cells are arranged in parallel while NAND cells are arranged in series. Floating gate 58 is not directly biased, in that its electrical voltage floats. The control gate 62 may be biased to transfer part of the voltage to the floating gate. Electric current passing between source 54 and drain 56 depends largely on the biasing of voltage of control gate 62 and then of floating gate 58 relative to substrate 52. If a suitable electric charge is maintained in floating gate 58, a channel (not shown) may form between source 54 and drain 56 allowing current to flow.

This disclosure describes a variety of embodiments of a flash memory programming technique 520, as may be performed by a flash memory controller 97, to program flash memory cells 50 in a manner that is to provide reliable performance both early in operational life after a number of program/erase cycles. Designers may attempt to increase programming speed of flash memory devices by using shorter programming pulses or raising programming voltages. Flash memory programming technique 520 may monitor degradation of flash memory cell 50 during cycling to adjust the programming settings during programming operations.

Figure 7:
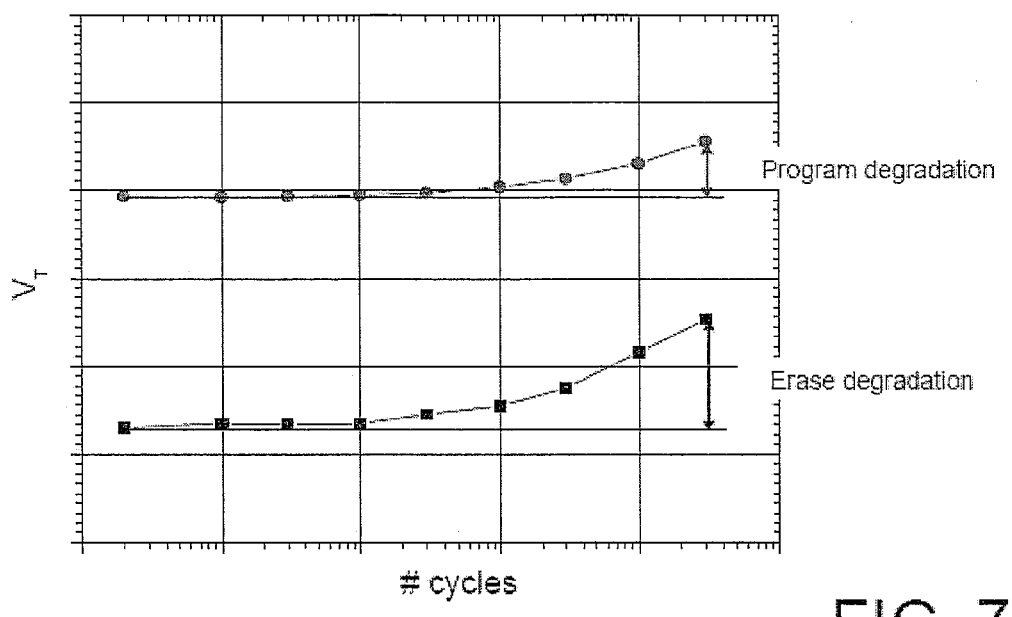
FIG. 7 is a plot of voltage versus number of cycles for a cycling degradation of a flash memory cell according to an embodiment.

Programming speed of flash memory cells may change over their lifetimes, by being programmed slower if fresh as compared to after cycling. For example, a voltage response of flash memory cells 50 may also change over the lifetime of flash memory cells 50. Effects of programming changes may be reduced by selectively programming the flash memory cells 50, such as by using fewer voltage programming pulses 610. After several program and erase cycles, flash memory cells become more aged in which the tunnel oxide is aged because electrons are trapped inside the tunnel oxide 57. When aged, cells appear faster during program (with respect to fresh case) because of the presence of additional electrons in the tunnel oxide. For example, FIG. 7 shows results of erase degradation, wherein threshold voltage $V_T$ of NAND flash memory cells increases as the number of program-erase cycles increases. Similarly. program degradation may result in threshold voltage $V_T$ of memory cells increasing as the number of program-erase cycles increases.

Figure 6A:
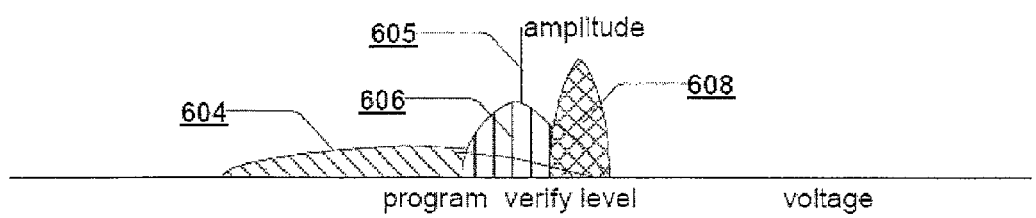
FIG. 6a is a threshold voltage distribution of a number of flash memory cells during programming according to an embodiment.

Cycling (e.g., aging) of flash memory cells may result in an increased voltage distribution compared to fresh flash memory cells in FIG. 6*a*. Threshold voltage $V_T$ of flash memory cell 50 may be considered as the voltage, as viewed from control gate 62, having a particular current flowing in a channel extending between source 54 and drain 56 of flash memory cell. A threshold voltage for a flash memory cell may be altered by an amount of charge put on a floating gate of the flash memory cell. If a voltage applied to control gate 62 exceeds threshold voltage $V_T$, flash memory cell 50 may be read or sensed in an ON state, and current may be allowed to flow between source 54 and drain 56. If a voltage applied to control gate 62 is below threshold voltage, flash memory cell 50 may be read or sensed in an OFF state and current is limited from flowing between source 54 and drain 56.

Figure 3:
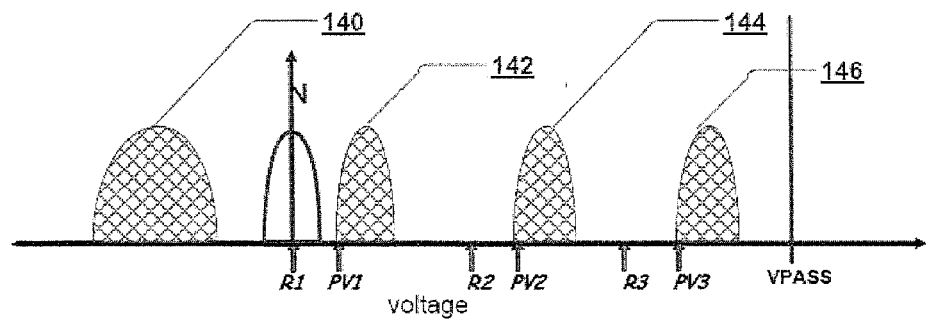
FIG. 3 is a plot of four output voltage states corresponding to four distinct voltage levels of a flash memory device according to an embodiment.
Figure 4:
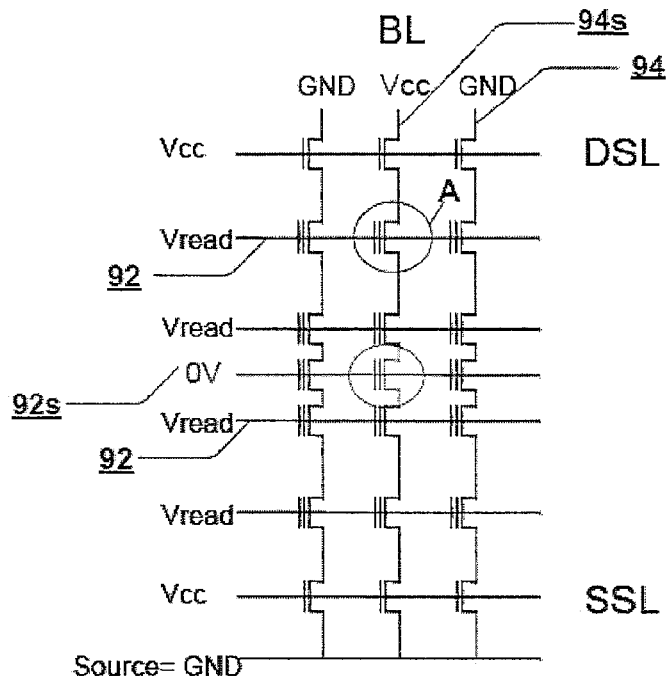
FIG. 4 is a schematic diagram of a flash memory device during a read operation phase according to an embodiment.

An over-programming condition may be induced in flash memory device 51 described with respect to FIG. 4. As described with respect to FIG. 4, flash memory cell A is over programmed, and the flash memory cell that is circled may be erased. As such, the flash memory cell that is circled may be read as programmed because of the over programmed cell. As flash memory cells become over programmed, threshold voltage $V_T$ may approach or even exceed $V_{READ}$ level or, in case of multilevel device, may reach the upper $V_{TH}$ distribution as described with respect to FIG. 3. With certain read operations, voltage applied to a large number of flash memory cells reach $V_{READ}$ level. This over programming may occur in those flash memory devices that are operationally attached to one bit line 94, as described with respect to FIGS. 1, 2, 4, and 5 (e.g., reading bit line).

Over programmed conditions may result in such operational failures as an incorrect READ indication. Unfortunately, such aged or cycled flash memory cells 50 may also enter over programming condition sooner. A threshold voltage of flash memory cell A of FIG. 4, for example, may approach $V_{READ}$ voltage level. As such, over programmed flash memory cell A may be maintained at a voltage level above $V_{READ}$. With over programming, during read operations, flash memory cell 50 may, under certain conditions, read a voltage level corresponding to an OFF state, even if exposed to a voltage level corresponding to ON state.

Certain flash memory devices (such as NAND devices) may be particularly susceptible to over programming. As flash memory cells cycle through successive programming and erasing iterations, they may enter an over-programmed state. Over-programming may limit the useful life of the flash memory device.

Flash memory cells 50 may be programmed to transition from a "1" state to a "0" state. By comparison, flash memory cells 50 may be erased to transition from "0" state to "1" state. Flash memory cells 50 may be programmed on a bit-by-bit basis. By comparison, flash memory cells 50 may be erased either by erasing flash memory cells 50 through an entire array (e.g., a matrix), or by erasing smaller groups of flash memory cells (which may be referred to herein as block or sector).

Flash memory cells 50 may comprise either single bit flash memory cells or multilevel bit flash memory cells. Single bit flash memory cells 50 may switch their single bit between "0" and "1" states. Multilevel bit flash memory cells may store two or more bits of information that may correspond to four (or more) indicated voltage level states. The four multilevel bit flash memory cell may drive data states may corresponding to four respectively incrementally increasing voltage levels 140, 142, 144, and 146 as indicated in FIG. 3. The incrementally increasing voltage levels 140, 142, 144, and 146 may correspond with charge states 11, 10, 00, and 01 of flash memory cell.

A programming voltage applied to multilevel bit flash memory cells 50 may be more strictly controlled than a programming voltage applied to single bit flash memory cells. Such control of the programming voltage level of multilevel bit flash memory cells may result in confusion of output voltages between adjacent voltage states. For instance, respective voltage levels 140, 142, 144, and 146 may represent corresponding states 11, 10, 00, and 01. Hence, there may be less of a voltage difference between adjacent states 11, 10, 00, and 01 than between adjacent states using single bit flash memory cells. Multilevel bit flash memory cells may thereby exhibit an increased probability of voltage ambiguities or errors (particularly read-type errors) resulting from variations in stored voltage levels. Such decreased voltage differences between states may also increase incidences of over programming.

Figure 5:
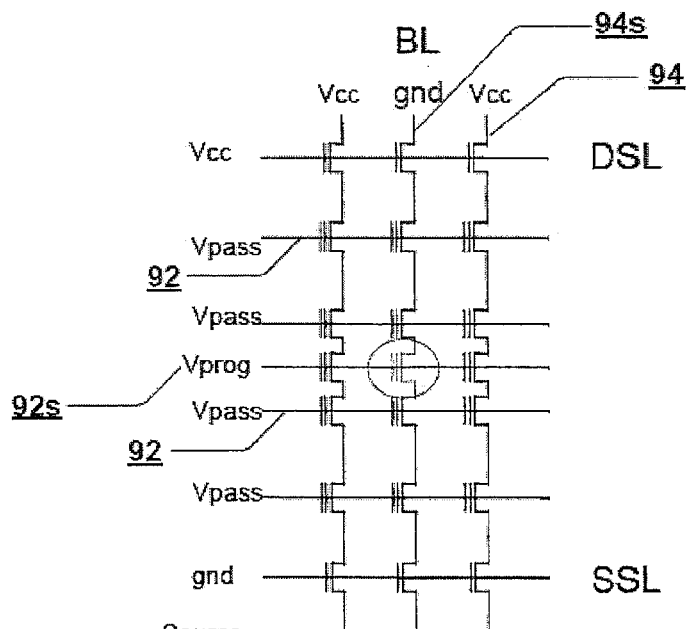
FIG. 5 is a schematic diagram of a flash memory device during a program operation phase according to an embodiment.

Programming operations, particularly in NAND flash memory cells, may be performed by Fowler-Nordheim tunneling. Bias conditions for such programming operations are shown in FIG. 5 for a particular example. A positive programming voltage $V_{PROG}$ that is adequate to induce FN tunneling may be applied, for example, to instantaneously selected word line 92*s*. A positive voltage $V_{PASS}$ that is applied to other word lines 92, has a lower voltage than the programming voltage $V_{PROG}$ that is applied to instantaneously selected word line 92*s*. Instantaneously selected bit line 94*s* may be at 0V so that the channel of the string of flash memory cells 50 is grounded, and electric field across tunnel oxide may be maintained at a selected flash memory cell. On the other side, unselected bit lines 94 may be biased to $V_{CC}$ that may be at a greater voltage than instantaneously selected bit line 94*s*. In this manner, electric field induced across the tunnel oxide is insufficient to program the cells. DSL (drain selector) may be switched off if channel is being boosting, to limit electrical flow via substrate through DSL.

Such programmed flash memory biasing techniques may apply a suitable biasing electric voltage based at least in part on a biasing response. Programming flash memory cells based on over programming voltage responses may assist in overcoming over programming.

Figure 6B:
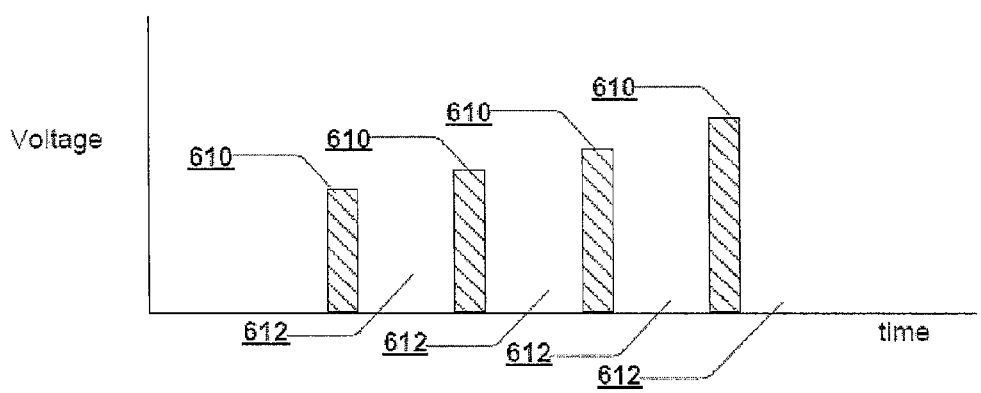
FIG. 6b is a plot of programming voltage versus time according to an embodiment.

FIG. 6*b* relates to a programming technique, referred to herein as Incremental Step Pulse Program (ISPP), which may provide for a series of incrementally increasing programming pulses 610 to be applied to selected word lines. After an incrementally increasing pulse 610 (and between a successive pair of pulses), a verify operation 612 may verify those flash memory cells that have been programmed. For those flash memory cells that have been program verified, selected bit line 94 of selected flash memory cell 50 may be boosted to a level that maintains voltage level in floating gate 58, and thereby may maintain non-volatile charge in flash memory cell 50.

Threshold voltage $V_T$ distributions 604, 606, and 608, as described with respect to FIG. 6*a*, each represent a distribution of a number of flash memory cells following programming, based on their threshold voltage levels. Flash memory cell 50 may be successfully programmed if its threshold voltage exceeds the program verify (PV) level, indicated by vertical line 605 of FIG. 6*a*. Flash memory cells that are satisfactorily programmed or program verified may not need further programming. Those flash memory cells that have not been satisfactorily programmed or program verified (are in the portion of distribution to left of vertical line 605 in FIG. 6a) may undergo further processing to further raise their threshold voltage $V_T$ to program verify level.

According to an embodiment, threshold voltage $V_T$ distribution 604 may illustrate a program distribution following a first programming pulse. Threshold voltage $V_T$ distribution 606 may illustrate a distribution following a number of programming pulses, but where not all of the flash memory cells 50 have been satisfactorily programmed. Threshold voltage $V_T$ distribution 608 illustrates a distribution following a sufficient number of programming pulses to successfully program a flash memory cell 50. Following more programming operations, threshold voltage distribution 608 may become narrower than original distribution (e.g., 604), and its minimum threshold voltage $V_T$ is at or above PV level.

As flash memory cells 50 age, they may improve their programming efficiency. Hence, as described with respect to FIG. 5, a number of programming pulses sufficient to program aged flash memory cells may be lower than with fresh flash memory cells. If certain flash memory cells 50 become too degraded, flash memory cells 50 may have a high threshold voltage even after a first pulse. A threshold voltage for such degraded single bit flash memory cells may be higher than PV level and also near to $V_{READ}$. In the particular case of multilevel bit flash memory cells 50, a threshold voltage may be closer to an upper end of threshold voltage distribution 608 (e.g., to the right as described with respect to FIG. 6a).

Flash memory controller 97 of FIG. 1 may apply voltage $V_{START}$, using flash memory programming technique 520, to at least portions of flash memory cell 50. Within this disclosure, a number of voltage levels are described as being assigned to $V_{START}$ (e.g., $V_{TEST}$, $V_{NEW}$, nominal voltage). $V_{START}$ may be selected based at least in part on cycling degradation, and there may be inaccuracies of degradation rates between actual and nominal.

2. Flash Memory Programming Technique

Flash memory programming technique 520 may be characterized as flash memory controller 97 of FIG. 1 controlling programming and erase voltages to at least one flash memory cell 50. A flash memory control may program flash memory cells with particular voltage levels, such as $V_{NEW}$ and $V_{TEST}$. Such voltage levels as $V_{NEW}$ and $V_{TEST}$ may be stored in memory 807 of flash memory controller 97, and accessed as suitable. Certain aspects of flash memory programming technique 520 may provide for a high programming speed, even for fresh flash memory cells that are not cycled or aged. Flash memory controller 97 may monitor at least one output electric voltage and/or current response from the at least one flash memory cell 50. Flash memory controller 97 may sequentially maintain programming pages within block 110 from a first page 0 to a last page n, as described with respect to FIG. 1.

In a NAND flash memory cell the programming operation is usually sequential. That is, inside one block, a first page to be programmed is page 0 and a last page to be programmed is page n, where n is the total number of pages in the block. With such sequential programming, page 0 may be programmed with the $V_{START}$ set during an initial testing which takes into account cycling degradation. This $V_{START}$ voltage level is initially assigned $V_{TEST}$. After page 0 programming completes, a new starting voltage $V_{NEW}$ may be determined as a function of the programming efficiency of page 0. The programming efficiency may be based on page 0 results. $V_{NEW}$ may then be used to program remaining pages in a block. Flash memory cells 50 may be programmed using flash memory programming technique 520 for a number of programming cycles that may differ for a flash memory cell. As a flash memory cell 50 becomes programmed, it does not undergo further programming. A voltage of a programming pulse may be increased incrementally following a programming cycle. Voltage $V_{NEW}$ may equal, but not be limited to, a programming pulse voltage in which for the first time some cells are verified programmed. Alternately, $V_{NEW}$ may equal, but not be limited to, a voltage level of a programming pulse after which in a next programming pulse, at least some cells are verified programmed for the first time. During $V_{TEST}$ programming, flash memory cells may operate faster by reducing a number of programming pulses to accurately determine programming and erase degradations, as described with respect to FIG. 7.

Figure 8:
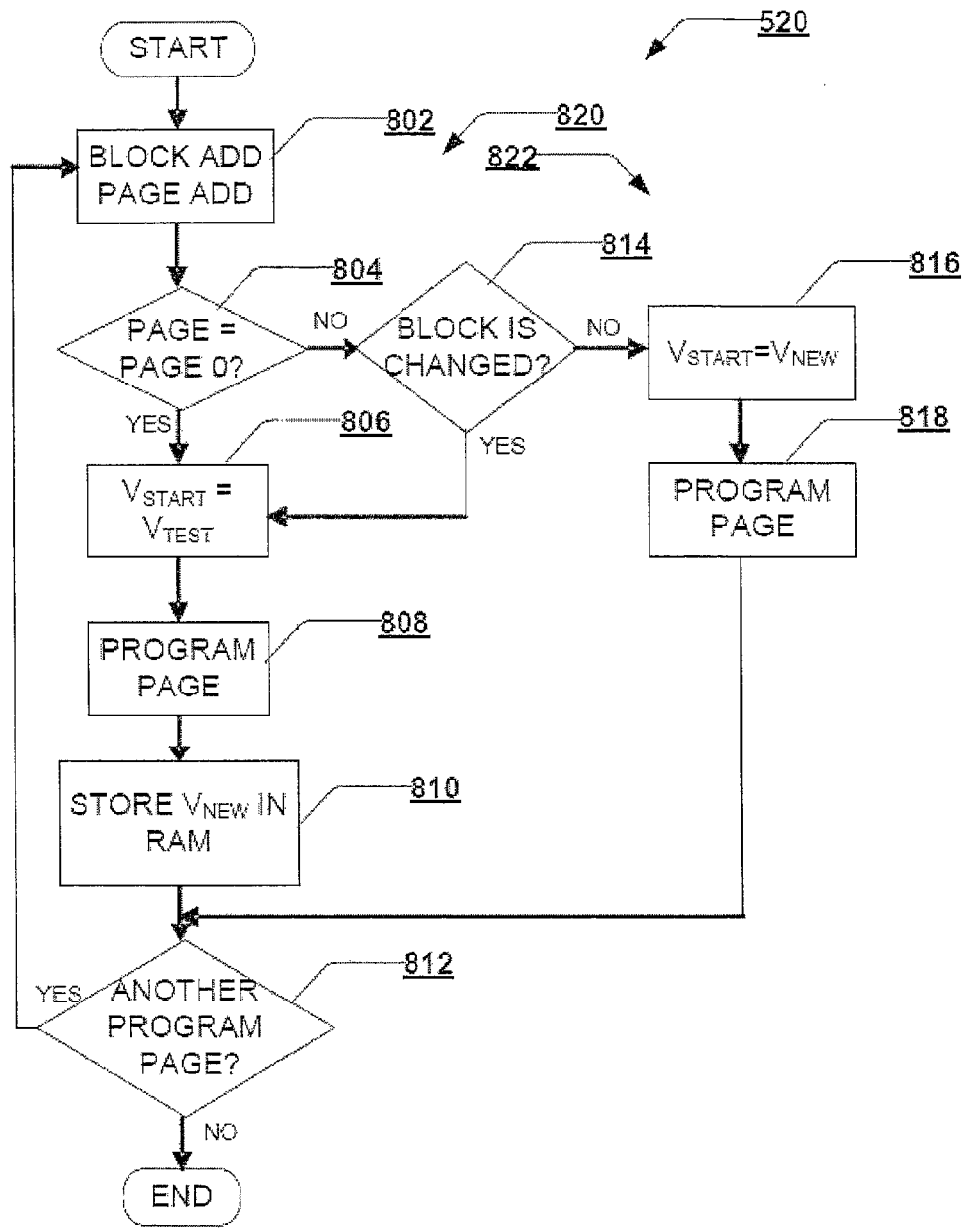
FIG. 8 is a flow diagram illustrating one aspect of a programmed flash memory biasing process according to an embodiment.

Certain aspects of flash memory programming technique 520, as described with respect to FIG. 8, may use volatile memory to store $V_{NEW}$. At a time that page 0 is programmed, or upon selection of the block selected for the program changes, $V_{START}$ may be assigned $V_{TEST}$. Flash memory programming technique 520 may be advantageous if programming is performed on pages sequentially within a block (e.g., programming from page 0 to page n). Details of the FIG. 8 flow chart are described later in this disclosure.

Figure 9:
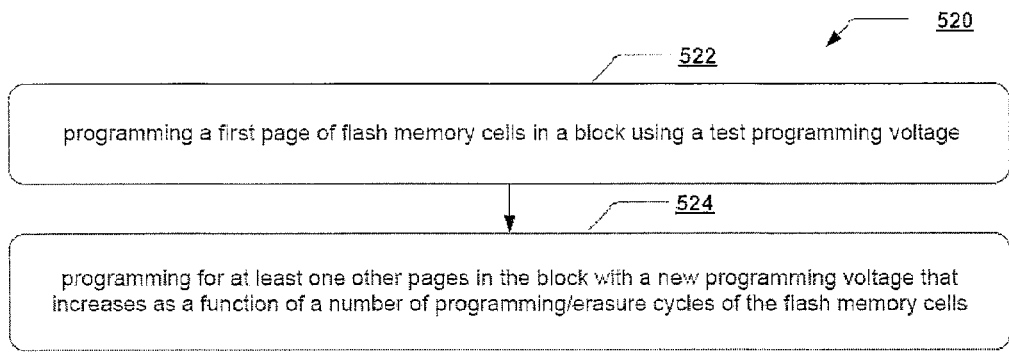
FIG. 9 is a flow diagram illustrating another example of a programmed flash memory biasing process according to an embodiment.

FIG. 9 is a flow chart of a flash memory programming technique that includes, but is not limited to, procedure 522 and procedure 524 according to an embodiment. Procedure 522 may include, but is not limited to, programming flash memory cells using a test programming voltage maintained in a first page in a block. For example, test-programming voltage $V_{TEST}$ that is determined during initial testing may be set to compensate for cycling degradation. Procedure 524 may include, but is not limited to programming for at least one other page in the block with a new programming voltage that increases as a function of a number of programming/erasure cycles of the flash memory cells. In certain instances, a test programming voltage may be determined based, at least in part, on the age, or number of programming cycles applied to a flash memory cell. For example, a new programming voltage $V_{NEW}$ may be determined based, at least in part, on program efficiency, and $V_{NEW}$ may substantially equal a programming voltage after which in the next programming pulse at least some cells may be verified programmed for the first time. Alternately, new programming voltage may be determined based, at least in part, on program efficiency that substantially equals a programming pulse voltage level which for the first time at least one flash memory cell of a programming page is verified as being programmed.

Certain flash memory cells 50 contained within array of flash memory device 51 may be operationally characterized as data flash memory cells and spare-type flash memory cells. Data flash memory cells may comprise flash memory devices that device manufacturers, end users, or application programs use to control programming. By comparison, spare-type flash memory cells may comprise flash memory devices that device manufacturers, end users, or application programs may not program. Spare-type flash memory cells may be considered as spare or additional flash memory cells compared to data-type flash memory cells.

Certain flash memory cells 50 contained within array of flash memory device 51 may be operationally characterized as data flash memory cells and spare-type flash memory cells. Data flash memory cells may comprise flash memory devices that device manufacturers, end users, or application programs use to control programming. By comparison, spare-type flash memory cells may comprise flash memory devices that device manufacturers, end users, or application programs may not program. Spare-type flash memory cells may be considered as spare or additional flash memory cells compared to data-type flash memory cells.

Figure 10:
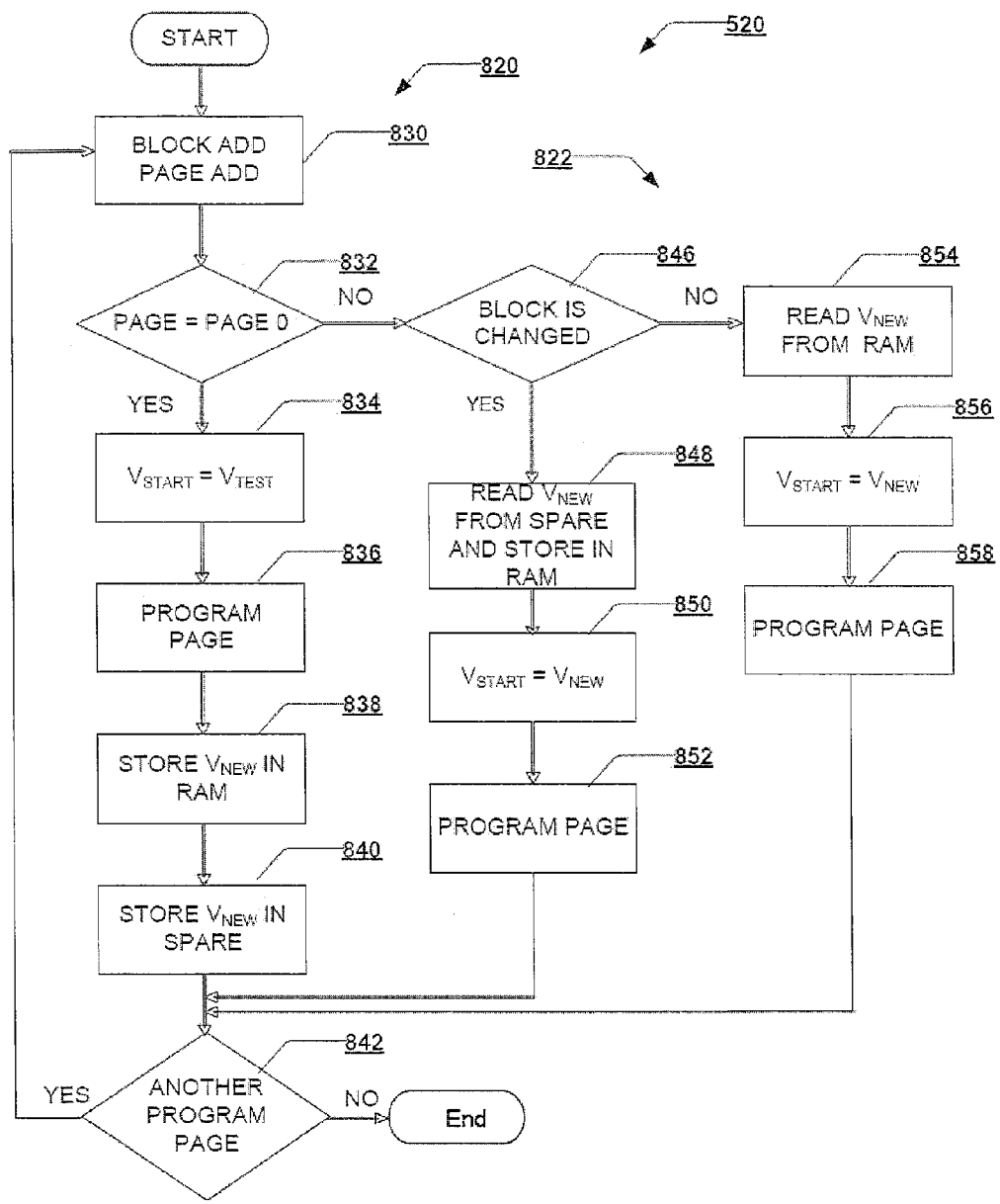
FIG. 10 is a flow chart illustrating one embodiment of programmed flash memory biasing technique.

Programming time in both FIGS. 8 and 10 implementations of flash memory programming technique 520 may be decreased by decreasing a number of applied programming cycles. However, programming time may increase due to time to write and read one or more signals representing $V_{NEW}$.

For both FIG. 8 and FIG. 10 embodiments of flash memory programming technique 520, if $V_{NEW}=V_{TEST}$, the $V_{TEST}$ level that is maintained in memory may be used. $V_{NEW}$ may not be stored since the level is already stored. This may limit time used for incrementally increasing programming of flash memory cells.

With the use of flash memory programming technique 520, $V_{TEST}$ may determine suitable default voltage levels during an initial programming test of the flash memory device itself. $V_{TEST}$ default voltage level may be selected so as to limit over programming. A default voltage level for $V_{TEST}$ may be sufficiently high so as to not result in excessive step-wise programming iterations as shown in FIG. 6B as the voltage is stepped to a suitable operating level. Flash memory programming technique 520 may, by having its initial voltage levels sufficiently high to limit excessive step-wise programming iterations, reduce the effects of cycling degradation (programming and erasing) of flash memory cells. Such a reduction in programming time may be calculated using FIG. 10 flash memory programming technique 520 embodiments.

A number of time and voltage constants may be applicable to flash memory cells, as described herein. Time sufficient to program a page with $V_{TEST}$ may be referred to as $t_{TEST}$. Also, $t_{NEW}$ may comprise a time sufficient to program a page with $V_{NEW}$ and $t_R$ the read time for a page. Different configurations can have distinct timing, such as may provide a time saving if, for example, the number of programming pulses is reduced during programming.

Reductions in programming time may be determined as follows: A) to program a whole block from page 0 to page n as described with respect to FIG. 1, an amount of the reduction may approximate some multiple of $t_{TEST}$ in both the FIG. 8 and FIG. 10 embodiments of the flash memory programming technique 520 in both FIG. 8 and FIG. 10 embodiments of the flash memory programming technique 520. Moreover setting of $V_{TEST}$ to lower voltage levels may permit a better functionality and reliability after several programming and erase cycles. These values merely approximate and are intended as examples. Here, there is a reduction of the number of programming pulses. The effective reduction may depend on the particular flash memory device being programmed.

This disclosure relates to programming/erasing of a flash memory device. The time for programming certain flash memory devices using flash memory programming technique may remain substantially constant over an entire life of a flash memory device 51. In addition, programming time for fresh flash memory cells may actually be reduced using flash memory programming technique 520. Flash memory programming technique 520 may permit the setting of a programming voltage of first voltage programming pulse 610 closer to voltage levels to improve functionality and reliability for flash memory devices. The use of flash memory programming technique 520 may reduce occurrence of overprogramming in flash memory cells.

2. Flash Memory Controller

This disclosure describes a number of implementations of flash memory controller 97 as described with respect to FIG. 1, which are intended to control programming of the flash memory cells of the flash memory device 51.

Certain implementations of flash memory controller 97 may be, but not necessarily be, implemented in products including one or more processors with applications to communicate with flash memory cells through flash memory controller 97. Certain ones of the processors can include, for example, a host processor adapted to run one or more application programs. Certain implementations of flash memory controller 97 as described with respect to FIG. 1 may be segmented into modules, configured as a unitary device, a networked device, a stand alone device, and/or any combination of these and other known type devices.

Certain implementations of flash memory controller 97, as described with respect to FIG. 1, as well as certain aspects of flash memory device 51, may take any of several forms that may involve firmware, hardware, software, and/or hard-wired logic. It is understood in such technologies and architectures how certain operations and functions may be performed alternately using software, hard-wired logic, computer-based, electronic device-based, electro-mechanically based, as well as firmware-based, or other such implementations. For example, certain implementations of flash memory device 51 may, for example, at least partially utilize one or more of: microprocessor-based technology, microcomputer-based technology, display technology, imaging technology, general-purpose computer technology, specific-purpose computer technology, Application-Specific Integrated Circuits (ASICs), and/or a variety of other computer, electronics, electromagnetic, imaging, visualizing, and/or information providing technologies, such as may be utilized by certain implementations of flash memory controller 97.

Certain implementations of flash memory controller 97 may as described with respect to FIG. 1, as well as other locations in this disclosure may include depending on context a processor 803 such as a central processing unit (CPU), a memory 807, a circuit or circuit portion 809, and an input output interface (I/O) 811 that may include a bus (not shown). Certain implementations of flash memory controller 97 of flash memory cells 50 may include and/or be a portion of a general-purpose computer, a specific-purpose computer, a microprocessor, a microcontroller, a digital signal processor, a personal display assistant (PDA), a cellular phone, a wireless communicating device, a hard-wired communication device, and/or any other known suitable type of communications device or phone, computer, and/or controller that may be implemented in hardware, software, electromechanical devices, and/or firmware. Certain implementations of flash memory controller 97 of flash memory device 51 may control wireless signal processing, database querying and response, computational, timing, data transfer, and other processes associated with flash memory programming, monitoring, testing, and/or control such as may be adjusted by and/or controlled by certain implementations of flash memory controller 97 of flash memory device 51.

Certain implementations of memory 807 of flash memory controller 97 may include a random access memory (RAM) and/or read only memory (ROM) that together may store computer programs, operands, and other parameters that control operation of certain aspects of flash memory controller 97 of the flash memory device 51. Memory 807 may be configurable to contain information representative of data, images, visualizations, image information, etc. that may be obtained, retained, or captured by that particular flash memory controller 97, as described in this disclosure.

Certain implementations of bus may be configurable to provide for digital information transmissions between processor 803, circuits 809, memory 807, I/O 811 (each of which may be integrated or removable), other portions within flash memory device 51, and/or other portions outside of flash memory device 51. In this disclosure, memory 807 may be configurable as RAM, flash memory, semiconductor-based memory, of any other type of memory that may be configurable to store data and/or suitable information. Certain implementations of bus may also connect I/O 811 to the portions of certain aspects of flash memory controller 97 of flash memory device 51.

In certain aspects, I/O 811 provides an interface to control transmissions of digital information between the components in certain implementations of flash memory controller 97 of flash memory device 51. Circuits 809 may include such other user interface devices as a display and/or a keyboard. In other aspects, flash memory controller 97 may be constructed as a specific-purpose computer such as an application-specific integrated circuit (ASIC), a microprocessor, a microcomputer, or other similar devices.

3. Implementations of Flash Memory Programming Technique with Relevant Flowcharts Within the disclosure, flow charts of the type described in this disclosure apply to processes as performed by a computer or controller as could be contained within certain implementations of flash memory device 51, as described in this disclosure.

FIG. 8 illustrates one embodiment of flash memory programming technique 520 that may utilize a number of procedures 802, 804, 806, 808, 810, 812, 814, 816, and 818. A controller, computer, or processor, as understood by those skilled in the art, may perform flash memory programming technique 520. Procedures 804, 806, 808, 810, 812 of flash memory programming technique 520 may be characterized as $V_{TEST}$ branch 820, which may be performed for the first programming page of block. $V_{TEST}$ voltage level may be determined during initial programming as may be provided, for example, in factory. Initial testing may consider the age (e.g., cycling degradation) of the flash memory cells 50. Procedure 802 involves determining or sequencing the block reference or page reference. For instance, procedure 802 may determine whether a particular page to be programmed is the first page for a block. Decision procedure 804 may determine whether a current page is the first page of a memory block. If so, flash memory programming technique 520 continues to procedure 806; if not it continues to decision procedure 814. In procedure 806, $V_{TEST}$ is assigned to $V_{START}$. $V_{START}$ may be a default voltage at which those flash memory cells being programmed in the block are being programmed. $V_{TEST}$ may be an initial voltage level determined during initial programming as may be provided, for example, in factory. The initial voltage level $V_{TEST}$ may be determined based at least partially based on the number of cycles of flash memory device. Procedure 808 involves programming the page, such that the voltage level of $V_{TEST}$ may be programmed into memory using flash memory controller 97 as described with respect to FIG. 1. Procedure 810 comprises setting $V_{NEW}$ in RAM. Having $V_{NEW}$ in RAM may allow an increased rate at which data may be accessed. It should be understood, however, that $V_{NEW}$ could be stored in memory other than RAM. As such, if flash memory cells are new, the $V_{TEST}$ voltage level may be set in RAM, but by comparison if flash memory cells are cycled, the number of cycles may be considered using the $V_{NEW}$ voltage level during programming. Decision procedure 812 comprises determining whether there is another page to program. If so, flash memory programming technique 520 continues to 802.1f answer to decision procedure 804 is no, then flash memory programming technique 520 continues to 814, at which it is determined whether block has changed. A current block may change if pages in the block have been pro-grammed. If so, flash memory programming technique 520 continues to 806 to program a new block starting with first page as described above. If no, flash memory programming technique 520 continues to procedure 816 along $V_{NEW}$ branch 822. Procedures 816 and 818 of flash memory programming technique 520 may be characterized as $V_{NEW}$ branch 822, which may be performed by programming sequential pages for block. $V_{NEW}$ branch 822 may program its flash memory cells as a function of programming efficiency. Procedure 816 comprises setting $V_{NEW}$ to $V_{START}$. Such programming efficiency by using $V_{NEW}$ may substantially equal a programming voltage after which in the next programming pulse at least some flash memory cells are verified programmed for the first time. Alternately, such programming efficiency by using $V_{NEW}$ may be based on a programming pulse voltage level which for the first time at least one flash memory cell of a programming page is verified programmed. Procedure 818 comprises programming $V_{NEW}$ into an appropriate page of block. Following procedure 818, flash memory programming technique 520 continues to decision procedure 812 as described above.

FIG. 10 illustrates one embodiment of flash memory programming technique 520 that may utilize a number of procedures 830, 832, 834, 836, 838, 840, 842, 846, 848, 850, 852, 854, 856, and 858. A controller, computer, or processor, as understood by those skilled in the art, may perform flash memory programming technique 520. Procedures 832, 834, 836, 838, 840, 842 and 846 of flash memory programming technique 520 may be characterized as $V_{TEST}$ branch 820, which may be performed for the first programming of block. $V_{TEST}$ voltage level may be determined during initial programming such as in a factory. Initial testing may consider the age (e.g., cycling degradation) of the flash memory cells 50. Procedure 830 involves determining or sequencing the block reference, or determining page reference. For instance, it may be determined whether a particular page to be programmed is the first page for a block, according to procedure 830. Decision procedure 832 may determine whether page=page 0, or the first page for a programmed block. If so, flash memory programming technique 520 continues to procedure 834; if not it continues to decision procedure 846. In procedure 834, $V_{TEST}$ is set to $V_{START}$. $V_{START}$ may comprise a default voltage at which those flash memory cells being programmed in the block are being programmed. $V_{TEST}$ may comprise an initial voltage level determined during initial programming such as in a factory. The initial voltage level $V_{TEST}$ may be determined based at least partially on a number of cycles of flash memory device. Procedure 836 involves programming $V_{TEST}$ into suitable page of memory cells. As such, voltage level $V_{TEST}$ may be programmed using flash memory controller 97 as described with respect to FIG. 1. Procedure 838 comprises setting $V_{NEW}$ in RAM. As such, if flash memory cells are new, one or more signals representing $V_{TEST}$ voltage level may be stored in RAM, but by comparison if flash memory cells are cycled, the number of cycles may be considered using $V_{NEW}$ voltage level during programming. Procedure 838 involves storing one or more signals representing $V_{NEW}$ in a spare area of memory. Procedure 840 may involve storing one or more signals representing $V_{NEW}$ into a spare area of memory. Decision procedure 842 comprises determining whether there is another page to program, and if so continues to procedure 830. If answer to decision procedure 832 is no, then flash memory programming technique 520 continues to 846 in which it is determined whether block has changed. Block may change, for example, if pages in the block have been programmed. If so, flash memory programming technique 520 continues to 848 reading $V_{NEW}$ from a spare area of memory and store in RAM. It may be desired to store $V_{NEW}$ in RAM because the information stored can be accessed faster than ROM memories. Each block can have its $V_{NEW}$ value that can be accessed quickly. However, in certain instances, $V_{NEW}$ may be stored in memory other than RAM. So if the block may changes, $V_{NEW}$ stored in RAM may be wrong, but may be replaced by the value stored in the spare area of the new block considered. Otherwise, flash memory programming technique 520 continues to procedure 854. Procedures 846, 848, 850, 852, 854, 856, and 858 of flash memory programming technique 520 may be characterized as $V_{NEW}$ branch 822, which may be performed by programming sequential pages for a block. $V_{NEW}$ branch 822 may program its flash memory cells as a function of programming efficiency. Procedure 848 comprises reading one or more signals representing $V_{NEW}$ for a spare and may be stored in RAM of other memory location. Certain flash memory programming techniques 520, of FIG. 10, may use not only a volatile memory but also a non-volatile memory to store signals representing $V_{NEW}$ voltage level. For example, certain of the non-volatile memories may be situated within the spare area of each page. This type of flash memory programming technique 520 may use the spare area if the selected block changes and the program operation is performed on those pages excluding page 0 (e.g., pages 1 to n of FIG. 1). Procedure 850 comprises setting $V_{START}$ to $V_{NEW}$. Such programming efficiency by using $V_{NEW}$ may substantially equal a programming voltage after which in the next programming pulse at least some cells may be verified programmed, such as for the first time. Alternately, such programming efficiency by using $V_{NEW}$ may be based, at least in part, on a programming pulse voltage level which for the first time at least one flash memory cell of a programming page is verified programmed. Procedure 852 comprises programming page of memory using $V_{NEW}$. Following procedure 852, flash memory programming technique 520 may continue to decision procedure 842 as described above. If the answer to decision procedure 846 is no, flash memory programming technique 820 continues to 854 that describes reading $V_{NEW}$ from RAM. $V_{NEW}$ may be stored in RAM so that data may be accessed quickly. Flash memory programming technique 520 continues to procedure 856 that comprises setting $V_{NEW}$ to $V_{START}$. Such programming efficiency by using $V_{NEW}$ may be based, at least in part, on a programming voltage after which in the next programming pulse at least some cells may be verified programmed for the first time. Alternately, such programming efficiency by using $V_{NEW}$ may be based, at least in part, on a programming pulse voltage level which for the first time at least one flash memory cell of a programming page is verified programmed. Procedure 856 comprises programming the page of block memory using $V_{NEW}$. Following procedure 856, flash memory programming technique 520 may continue to decision procedure 842 as described above.

Figure 2:
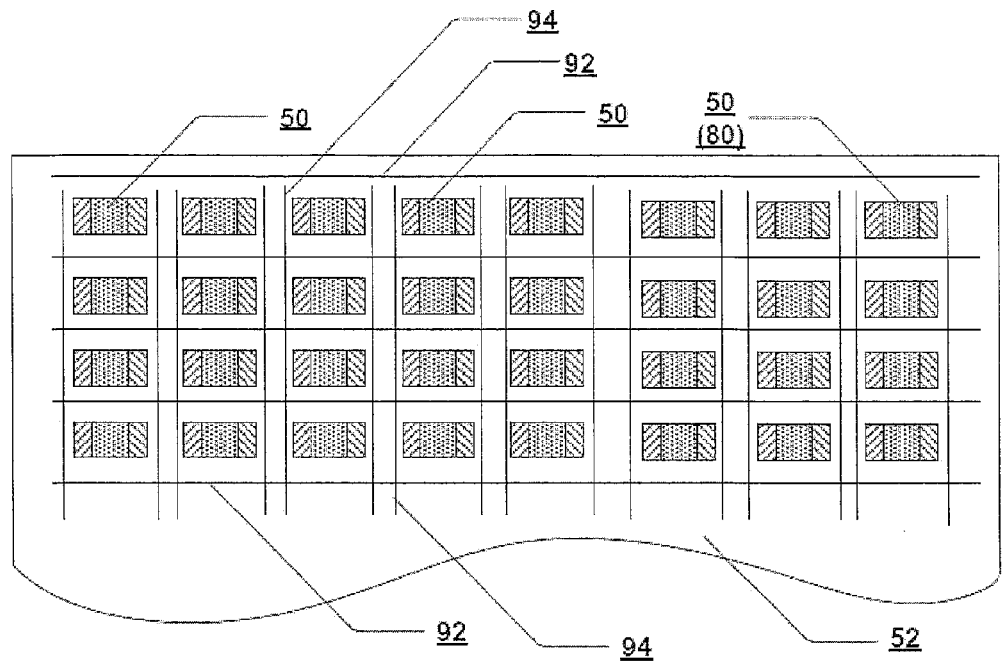
FIG. 2 is a plan view of a flash memory device according to an embodiment.

Array of flash memory cells 50 contained within flash memory device 51 of FIG. 2 may be operationally characterized as data flash memory cells and spare-type flash memory cells Data flash memory cells may be those flash memory cells that device manufacturers, end users, or application programs may program. By comparison, spare-type flash memory cells may be those flash memory cells that end users may not program. Certain flash memory programming techniques 520, of FIG. 10, may use not only a volatile memory but also a non-volatile memory to store the $V_{NEW}$ voltage level. Certain of the non-volatile memories may be the spare area of a page in the block, for example the spare area of page 0. This type of flash memory programming techniques 520 may use the spare area if the selected block changes and the program operation might be performed on those pages excluding page 0 (e.g., pages 1 to n of FIG. 1). While the flash memory programming technique may use RAM if the program operation is performed in the same block. Since $V_{NEW}$ may be stored both in RAM and then in a spare area of memory, the same $V_{NEW}$ may be used to program the spare area.

While certain exemplary techniques have been described as shown herein using various methods and systems, those skilled in the art that various other modifications may be made, and equivalents may be substituted should understand it. Additionally, many modifications may be made to adapt to a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

The invention claimed is:

1. A method, comprising:
   programming at least one flash memory cell using at least one programming pulse having a voltage level obtained from a memory location, wherein said at least one flash memory cell is contained within a page of a non-volatile memory block including a plurality of pages, and wherein the voltage level is based, at least in part, on a count of programming pulses used to program memory cells of another page of said non-volatile memory block, and on a count of program and erase cycles applied to the at least one flash memory cell, the count of program and erase cycles corresponding to a cycling degradation age of the at least one flash memory cell,
   wherein the at least one programming pulse having the voltage level is applied in programming pages in said non-volatile memory block except for said another page of said non-volatile memory block, and
   wherein said memory location is contained within a first page of said non-volatile memory block.

2. The method of claim 1, further comprising:
   programming at least one flash memory cell in said another page of said memory block using at least one other programming pulse having a test voltage level, the test voltage level being determined during an initial testing period.

3. The method of claim 1, wherein said programming pages in the non-volatile memory block are programmed sequentially.

4. The method of claim 1, wherein the voltage level is increased to compensate for the cycling degradation age of the at least one flash memory cell.

5. A flash memory device, comprising:
   at least one flash memory cell; and
   a controller adapted to apply a programming pulse to said at least one flash memory cell to program said at least one flash memory cell, wherein said at least one flash memory cell is contained within a page of a non-volatile memory block including a plurality of pages, and wherein said programming pulse comprises a programming voltage that is based, at least in part, on a count of programming pulses used to program memory cells of another page of said non-volatile memory block, and on a count of programming cycles or erasures applied to the at least one flash memory cell, the count of programming cycles or erasures corresponding to a cycling degradation age of the at least one flash memory cell, wherein the controller is further adapted to apply said programming pulse comprising said programming voltage in programming pages in said non-volatile memory block except for said another page of said non-volatile memory block, and wherein the controller is further adapted to retrieve one or more signals representative of said programming voltage from a location in a first page of said non-volatile memory block.

6. The flash memory device of claim 5, wherein the controller is further adapted to program said memory cells in said another page of said non-volatile memory block using at least one other programming pulse with having a test voltage level, the test voltage level being determined during an initial testing period.

7. The flash memory device of claim 5, wherein the controller is further adapted to program said programming pages in the non-volatile memory block sequentially.

8. The flash memory device of claim 5, wherein the programming voltage is increased to compensate for the cycling degradation age of the at least one flash memory cell.

9. A system, comprising:
a host processor adapted to host one or more application programs; and
a flash memory device coupled to said host processor, said flash memory device comprising:
at least one flash memory cell; and
a controller adapted to apply a programming pulse to said at least one flash memory cell to program said at least one flash memory cell, wherein said at least one flash memory cell is contained within a page of a non-volatile memory block including a plurality of pages, and wherein said programming pulse comprises a programming voltage that is based, at least in part, on a count of programming pulses used to program memory cells of another page of said non-volatile memory block, and on a count of programming cycles and erasures applied to the at least one flash memory cell, the count of programming cycles and erasures corresponding to a cycling degradation age of the at least one flash memory cell,
wherein the controller is further adapted to apply said programming pulse comprising said programming voltage in programming pages in said non-volatile memory block except for said another page of said non-volatile memory block, and
wherein the controller is further adapted to retrieve one or more signals representative of said programming voltage from a location in a first page of said non-volatile memory block.

10. The system of claim 9, wherein the programming voltage is increased to compensate for the cycling degradation age of the at least one flash memory cell.

11. The system of claim 9, wherein the programming voltage substantially equals a voltage level of at least one programming pulse applied after which a program verify voltage fails.

12. The system of claim 9, wherein the programming voltage substantially equals a programming pulse voltage level applied for a first time at which at least one flash memory cell is verified programmed.

13. The system of claim 9, wherein the controller is further adapted to program flash memory cells in said non-volatile memory in pages other than said first page of said non-volatile memory block using said programming voltage.

14. The method of claim 1, further comprising programming another flash memory cell using another programming pulse having a voltage level obtained from the memory location, wherein the another flash memory cell is contained within a different page of the plurality of pages of the non-volatile memory, and wherein the voltage level of the another programming pulse is based, at least in part, on a count of programming pulses used to program memory cells of the page of said non-volatile memory block, and on a count of program and erase cycles applied to the another flash memory cell.

15. The method of claim 1, wherein the voltage level is increased as a function of the count of programming pulses used to program the memory cells of the another page of said non-volatile memory block.

16. The method of claim 1, wherein the voltage level is increased as a function of the count of program and erase cycles applied to the at least one flash memory cell.

17. The device of claim 5, wherein the controller is adapted to apply another programming pulse to another flash memory cell to program the another flash memory cell, wherein the another flash memory cell is contained within a different page of the plurality of pages of the non-volatile memory block, and wherein the another programming pulse comprises a programming voltage that is based, at least in part, on a count of programming pulses used to program memory cells of the page of said non-volatile memory block, and on a count of programming cycles or erasures applied to the another flash memory cell.

18. The system of claim 9, wherein the controller is adapted to apply another programming pulse to another flash memory cell to program the another flash memory cell, wherein the another flash memory cell is contained within a different page of the plurality of pages of the non-volatile memory block, and wherein the another programming pulse comprises a programming voltage that is based, at least in part, on a count of programming pulses used to program memory cells of the page of said non-volatile memory block, and on a count of programming cycles or erasures applied to the another flash memory cell.

* * * * *